United States Patent Office 3,761,280

Patented Sept. 25, 1973

3,761,280

PHOTOGRAPHIC COMPOSITION COMPRISING LIGHT-SENSITIVE POLYMER

Erich Wolff, Leichlingen, Wolfgang Lässig, Munich, Eckart Seelig, Leverkusen, and Günther Kolf, Bergisch Gladbach, Germany, assignors to Agfa-Gevaert Aktiengesellschaft, Leverkusen, Germany No Drawing. Filed June 7, 1971, Ser. No. 150,752
Claims priority, application Germany, June 20, 1970, P 20 30 506.0
Int. Cl. G03c *1/70*
U.S. Cl. 96—115 R 1 Claim

ABSTRACT OF THE DISCLOSURE

Relief images are made by imagewise exposing and thereby cross-linking a light-sensitive polymer layer. The unexposed areas remain soluble in certain solvents and are washed off. The light-sensitive polymers contain the cinnamylidene acetic acid ester structure as defined below.

The invention relates to light sensitive layers which contain film-forming polymers which are cross-linked by the action of light.

It is known to use various polymers as light sensitive layers which, when exposed imagewise undergo an alteration in their solubility so that subsequent development with a solvent, which is adjusted to the polymer, dissolves out the parts of the layer which have not been cross-linked by exposure, whereas the exposed parts of the layer have been rendered insoluble by cross-linking and remain behind as relief of the layer support.

Such layers which can be cross-linked by light generally consist of a polymer with groups capable of cross-linking attached to it or of mixtures of suitable cross-linking agents with layer components which are not light-sensitive. The aforesaid cross-linking agents include e.g. bichromates, azides, cinnamic acid compounds and cinnamylidene acetic acid esters.

Mixed esters which can be cross-linked by light, obtained from polyvinyl alcohol, cinnamic acid and other carboxylic acids have been described in German Pat. 1,066,867. U.S. Pat. 3,257,664 relates to light sensitive layers of polyvinyl esters of cinnamylidene acetic acid.

The known light sensitive layers have, however, certain disadvantages, the main one being that their relatively low sensitivity to light in the visible region of the spectrum necessitates the use of special light sources, such as carbon arc lamps or xenon lamps, in order that exposure may be achieved within practically feasible exposure times.

It is an object of the present invention to provide a layer which can be cross-linked by light and which has improved sensitivity to light.

A light-sensitive material comprising a polymer layer which can be cross-linked by light has now been found wherein the crosslinkable polymer is a reaction product of cinnamylidene acetic acid esters which contain isocyanate groups, with a precursor polymer that has groups containing an active hydrogen atom capable of reacting with isocyanate groups.

The cross-linkable compositions of the present invention have the advantage, apart from improved light sensitivity in the ultraviolet region of the spectrum, of exhibiting a considerable shift in the spectral sensitivity towards the visible region of the spectrum. The layers according to the invention can, therefore, be cross-linked by contact exposure with the light sources normally used in reproduction work as well as by projection exposure with visible light and especially with laser beams.

Isocyanate-containing cinnamylidene acetic acid esters are esters of the lower alcohols, preferably with 1 to 6

C atoms, of a cinnamylidene acetic acid which contains an isocyanate group in the ortho-, meta- or para-position of the benzene ring.

The following are mentioned as specific examples of suitable isocyanate-containing cinnamylidene acetic acid esters for the present invention: Ethyl p-isocyanato-cinnamylidene acetate, ethyl-m-isocyanato-cinnamylidene acetate, butyl o-isocyanato-cinnamylidene acetate, n-hexyl p-isocyanato-cinnamylidene acetate, isopropyl m-isocyanato - cinnamylidene acetate, methyl m - isocyanato-cinnamylidene acetate.

The preparation of isocyanate-containing cinnamylidene acetic acid esters is explained for ethyl p-isocyanato-cinnamylidene acetate, as follows:

p-NITROCINNAMYLIDENE ACETIC ACID 500 g. of p-nitrocinnamaldehyde and
263.5 g. of malonic acid are dissolved in
1000 ml. of distilled pyridine by mild heating on a water bath.
5.5 ml. of piperidine are then added dropwise and the reaction mixture is stirred for 5 hours at room temperature and then for 5 hours at 120° C. to 140° C. When the evolution of gas has ceased, the reaction mixture is cooled with ice water and the precipitate formed is removed by suction filtration and washed thoroughly with acetone.

Yield: 218 g.
Melting point: 275° C.

ETHYL p-NITROCINNAMYLIDENE ACETATE 600 ml. of thionyl chloride are added dropwise to
218 g. of p-nitrocinnamylidene acetic acid with stirring.

The reaction mixture is boiled under reflux for 5 hours at an oil bath temperature of 100° C. until evolution of HCl ceases. The excess thionyl chloride is then drawn off under vacuum. The last residues are removed by distillation after the addition of benzene. The residue is dissolved in 525 ml. of absolute pyridine by mild heating and
450 ml. of absolute alcohol are then added dropwise.

The reaction mixture is then boiled under reflux for 3 hours, cooled in ice water, filtered under suction and thoroughly washed.

Melting point: 120° C. to 122° C. from alcohol.
Yield: 144.5 g.

Calculated (percent): C, 62.0; H, 5.83; N, 6.28. Found (percent): C, 63.5; H, 5.7; N, 6.20.

ETHYL p-AMINOCINNAMYLIDENE ACETATE 120 g. of ethyl p-nitrocinnamylidene acetate are dissolved in
1200 ml. of dioxane, Raney nickel is added and the ester is reduced by dropwise addition of 600 ml. of 25% hydrazine hydrate at 70° C.

107.5 g. (98%) of ethyl p-aminocinnamylidene acetate remain behind after filtration and removal of the solvent by evaporation.

Melting point: 90–92° C.

Calculated (percent): C, 71.9; H, 6.9; N, 6.5. Found (percent): C, 71.9; H, 7.3; N, 6.5.

Ethyl p-isocyanato-cinnamylidene acetate, melting point 66° C. to 68° C., is obtained from the aforesaid product in practically quantitative yield by the usual phosgenation process.

Calculated (percent): C, 69.2; H, 5.35; N, 5.76. Found (percent): C, 69.7; H, 5.35; N, 5.76.

Ethyl m-isocyanato-cinnamylidene acetate and other isocyanate-containing cinnamylidene acetic acid esters are prepared in a similar way.

Both natural and synthetic high molecular weight compounds are suitable for use as film-forming high molecular weight reactants for the production of the light sensitive material according to the present invention, provided they still contain reactive groups. Reactive groups in this context means groups which contain an active hydrogen atom and which are capable of reacting with isocyanate groups, e.g. OH, NH or COOH groups.

Cellulose, starch and gelatin or processed derivatives of these natural substances, e.g. partly esterified or etherified cellulose derivatives, are examples of natural polymers.

Suitable synthetic polymers are e.g. polyvinyl alcohol or copolymers which contain vinyl alcohol units in a polymerized form. These polymers may contain other units of polymerizable monomers as non-reactive polymer components, especially units of vinyl monomers, for example ethylene, propylene, butylene, butadiene, isoprene, vinyl chloride, vinylidene chloride, vinyl esters, specially vinyl acetate or vinyl propionate, vinyl ethers, e.g. vinyl propyl ether or vinyl isobutyl ether, acrylic or methacrylic acid derivatives such as esters, especially their esters with aliphatic alcohols which have up to 5 carbon atoms, nitriles, maleic acid anhydride or styrene. Partially saponified copolymers of ethylene and vinyl acetate are especially suitable.

Polycondensates which have active hydrogen atoms and especially those which contain alcoholic hydroxyl groups are suitable, for example hydroxyl-containing polyesters of polybasic aliphatic or aromatic carboxylic acids with polyhydric alcohols, hydroxyl-containing polyurethanes or polyethers or hydroxyl-containing epoxide resins which can be prepared e.g. by reacting polybasic carboxylic acids, alcohols or amines with epihalogen hydrins, in particular epichlorohydrin; polyamides are also suitable, provided they still contain reactive groups, for example reaction products of polybasic carboxylic acids with polyvalent amines.

The light-sensitive layers of the present invention are prepared by reacting the above described polymers with the isocyanate containing crosslinking compounds in a suitable solvent. In most cases the polymer is dissolved in a solvent that does not contain active hydrogen atoms, and a solution of the crosslinking compound in the same or a similar solvent solvent is added. The temperature is raised to 40–100° C. depending on the reactivity of the isocyanate and of the polymer. In some cases it is advantageous to add a catalyst for the addition of isocyanates to compounds with active hydrogen atoms, e.g. pyridin, diazabicyclo(2,2,2)octane. After a sufficient reaction time the product is precipitated by stirring the reaction mixture into a suitable solvent.

The polymeric reactants should advantageously have an average molecular weight of between 1000 and 100,000. The most suitable average molecular weight for any particular use or purpose can easily be determined by the usual tests. The optimum molecular weight range also depends, of course, on the nature of the polymer.

The light-sensitive polymers should contain at least 5 mols percent and preferably more than 8 mols percent of cinnamylidene acetic acid ester units which can be cross-linked by light. The upper limit depends on the nature and compoitsion of the polymer used. The units are in the form of the recurring groups

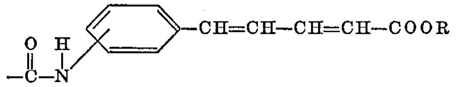

where COOR represents an esterified lower alcohol. The optimum quantity of cinnamylidene acetic acid ester units can be determined by simple tests. This again depends primarily on the nature and composition of the polymer but also on the thickness of the layer required.

The light sensitivity of the layers according to the invention can be increased by the addition of the usual sensitizers used for this purpose, e.g. triphenylmethane dyes, aromatic ketones, nitro compounds and especially substituted pyrylium or thiapyrylium salts. Such compounds have been described in U.S. Pat. 3,141,770 and in French Pat. 1,359,095. An even greater increase in sensitivity can be obtained by using cyanothioacetamide merocyanines as described, for example, in Belgian pat. specification 735,896. The quantity of sensitizer may be varied between 0.1 and 20% by weight based on the quantity of dry, film-forming polymer.

Exposure of the layers according to the present invention may be carried out with the usual light sources used in reproduction work, such as carbon arc lamps, xenon lamps or high pressure mercury lamps which in addition to visible light contain a proportion of ultraviolet light which is especially effective for photo cross-linking. The layers according to the invention may also be cross-linked with visible light by the projection process, and especially with laser beams.

Suitable developers for the exposed layers are generally organic solvents which may, but need not necessarily, be identical with or similar to the solvents used in preparation of the polymer layers which have not yet been cross-linked. It is preferable to use solvents in which the cross-linked parts of the layer undergo little or no swelling, such as butyl acetate, cyclohexanone or benzene, glycol ether, glycol-etheracetate or butanone.

The light-sensitive polymers may be used alone in the light-sensitive layer or mixed with other polymers. The latter use has certain advantages in many cases since it enables mixtures to be prepared which have certain particular properties such as solubility in various solvents or firmer bonding to special layer supports.

The components with which the light-sensitive polymers may be mixed are advantageously homopolymers or polymers of vinyl acetate, ethylene, derivatives of acrylic acid or methacrylic acid such as acrylamide or methacrylamide, esters of these acids, especially their esters with short chained aliphatic alcohols, or nitriles of these acids, or butadiene, isoprene, styrene or vinyl alcohol. Copolymers of vinyl acetate, vinyl alcohol, ethylene and norbornadiene or cyclopentadiene and copolymers of butadiene or isoprene with styrene and/or acrylonitrile may be mentioned as specific examples. The admixture of polymers which are not sensitive to light has the further advantage that unwanted prémature cross-linking of the light sensitive polymers during preparation of the layer can be practically completely suppressed.

The layers which can be cross-linked by light are prepared by dissolving the light-sensitive polymers in the usual manner and then applying them to a suitable layer support, if desired after the addition of a sensitizer. The solvent is then evaporated. If suitable mixing components are used, the layers may be produced as self-supporting layers without separate layer suports.

Suitable materials for use as layer supports are, for example, metal foils of copper, aluminium, zinc, magnesium or steel, or paper, glass or foils of polymer products such as cellulose esters, polyvinyl acetate, polystyrene or polycarbonates, especially those based on bis-hydroxyphenylalkanes, polyesters, especially those based on polyethylene terephthalate, and polyamides such as nylon. Materials which have a mesh structure such as metal meshes are also suitable for use as supports.

The light-sensitive layers according to the invention may be used for the production of relief images or printing forms for relief printing, intaglio printing or planographic printing. Special reference may be given here to offset printing processes, screen printing processes, lithographic printing plates or any other printing processes which require a relief image and engraving processes. One important application of the layers according to the invention is the production of so-called printed circuits.

The thickness of the light-sensitive layer may vary within wide limits. Thickness of between 0.001 and about 0.7 mm. are sufficient for the usual processes but for relief printing the thicknesses may be greater, between about 0.25 and 1.5 mm.

Example 1

Preparation of the polymer.—10 g. of a partly saponified polyvinyl acetate (degree of saponification 88 mols percent, average molecular weight 5,000 to 10,000) are swelled in 100 ml. of pyridine at 100° C. A further 100 ml. of pyridine are then added and part of the solvent is distilled off under vacuum. After cooling to 50° C., 6.15 g. of benzoyl chloride, 22.4 g. of ethyl p-isocyanato-cinnamylidene acetate and 6.15 g. of benzoyl chloride are successively added dropwise. The reaction mixture is stirred for one hour after each addition. The reaction product is then precipitated by stirring the reaction mixture into 2 l. of methanol.

Light-sensitive material.—A 10% solution of the precipitated above polymer in glycol acetate monomethylether is prepared and sensitized with 1% by weight, based on the dry film-forming polymer, of 4-(p-n-amyloxyphenyl) - 2,6 - bis-(p-ethylphenyl)thiapyrylium perchlorate. An aluminum foil is coated with the above solution and the layer is dried in the usual manner.

Processing.—The above layer is exposed to a carbon arc lamp (42 volt, 30 amp) for 1 minute through a band filter and a grey step wedge with density steps of 0.1 at a distance of 45 cm. It is then developed in red light for 2 minutes with a mixture of 4 parts of glycol acetate monomethyl ether, 2 parts of butanone, 1 part of butyl acetate and 1 part of ethyl acetate.

A sharp, positive relief image of the step wedge is obtained. The sensitivity at various wavelengths is shown in the following table.

| Experiment | Sensitizer, percent | Steps of grey wedge | Band filter wedge steps at (millimicrons)— 350 | 390 | 405 | 445 | 480 | 505 | 530 | 550 | 570 | 620 |
|---|---|---|---|---|---|---|---|---|---|---|---|---|
| a | None | 22 | 8 | 11 | 13 | | | | | | | |
| b | 1 | 32 | 19 | 27 | 29 | 27 | 28 | 22 | 10 | 5 | 3 | |

Example 2

Instead of using 4-(p-n-amyloxyphenyl)-2,6-bis-(p-ethylphenyl)-thiapyrylium perchlorate as in Example 1, the polymer is sensitized with 1%, based on the dry film-forming polymer, of 3-ethyl-benzoxazolyliden - 2 - ethylidene-cyanothioacetopyrrolidide.

The sensitivity at various wavelengths is shown in the following table.

| | |
|---|---|
| Quantity of sensitizer ______ percent | 1 |
| Steps of grey wedge | 33 |
| Band filter wedge steps, millimicrons: | |
| 350 | -- |
| 390 | 17 |
| 405 | 19 |
| 445 | 18 |
| 480 | 19 |
| 505 | 16 |
| 530 | 13 |
| 550 | 6 |
| 570 | 3 |
| 620 | -- |

As compared with the light-sensitive polymers described in U.S. Pat. No. 3,257,664, the instant polymers are considerably more sensitive to light of the longer wavelengths region of the visible spectrum. The over-all speed is about 6–10 times higher. The resolving power is highly improved and processing much more simple.

Example 3

Similar results are obtained when a saponified copolymer of ethylene and vinyl acetate (average molecular weight ~100,000) containing 22.3 mols percent of free OH groups is used instead of saponified polyvinyl acetate.

Example 4

Similar results are obtained when a saponified copolymer of polyvinyl chloride and polyvinyl acetate (containing 60 mols percent of free OH groups and having an average molecular weight of approximately 100,000), is used instead of the saponified polyvinyl acetate used in Example 1.

Example 5

The light sensitive layer described in Example 2 is applied onto glass plates (5 x 5 cm.). The dried layer had a thickness of 0.8 micron.

Thereafter the layer is exposed through a double beam interference grating using laser light from a krypton laser source ($\lambda$=520.8 millimicrons—exposure energy 7.5 mw./cm.$^2$—exposure time 4 sec.—spatial frequency 1470 lines/mm.).

The exposed layer is treated with butyl acetate for 5 minutes to wash off the unexposed areas of the layer, rinsed with distilled isopropanol and dried.

The diffraction efficiency is $\eta$=47% which is above the theoretical value of $\eta$=34% for gratings with sinusoidal modulation.

We claim:

1. A light-sensitive composition containing a polymer having recurring groups in a side chain of the following formula:

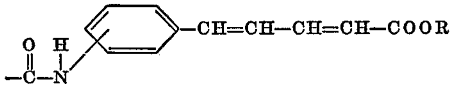

where COOR represents an esterified lower alcohol, said polymer being soluble in a solvent; and a sensitizer that increases the sensitivity of the polymer to light.

References Cited

UNITED STATES PATENTS

| | | | |
|---|---|---|---|
| 3,250,615 | 5/1966 | Van Allen et al. | 96—115 R |
| 3,257,664 | 6/1966 | Leubner et al. | 96—115 R |
| 3,655,625 | 4/1972 | Thomas | 96—115 R X |

RONALD H. SMITH, Primary Examiner

U.S. Cl. X.R.

96—33, 35.1; 204—159.14